(12) United States Patent
Engholm et al.

(10) Patent No.: US 8,452,559 B2
(45) Date of Patent: May 28, 2013

(54) DENSITY TRACE MEASUREMENT (75) Inventors: Kathryn A. Engholm, Portland, OR (US); Alfred K. Hillman, Jr., Banks, OR (US); John F. Turpin, Tigard, OR (US); David H. Eby, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 364 days.

(21) Appl. No.: 12/778,730

(22) Filed: May 12, 2010

(65) Prior Publication Data
US 2011/0282610 A1 Nov. 17, 2011

(51) Int. Cl.
*G01R 13/02* (2006.01)
(52) U.S. Cl.
USPC ............... 702/67; 702/86; 702/176; 702/180; 702/189
(58) Field of Classification Search
USPC .................... 702/86, 176, 180, 189; 382/168, 382/173, 181; 358/522; 348/672
See application file for complete search history.

(56) References Cited

U.S. PATENT DOCUMENTS

| | | | | |
|---|---|---|---|---|
| 4,291,315 A * | 9/1981 | Mizzi | ............................ | 346/76.1 |
| 5,459,314 A * | 10/1995 | Plasek | .......................... | 250/269.7 |
| 5,774,191 A * | 6/1998 | Iverson | .......................... | 348/592 |
| 6,240,282 B1 | 5/2001 | Kleider | | |
| 6,249,115 B1 | 6/2001 | Yost et al. | | |
| 8,204,107 B2 * | 6/2012 | Zhuang et al. | ................ | 375/240 |
| 2003/0198304 A1 | 10/2003 | Sugar | | |
| 2004/0028003 A1 | 2/2004 | Diener et al. | | |
| 2005/0057253 A1 | 3/2005 | Gee | | |
| 2007/0264939 A1 | 11/2007 | Sugar | | |
| 2009/0290793 A1 * | 11/2009 | Engholm et al. | .............. | 382/171 |

FOREIGN PATENT DOCUMENTS

| | | |
|---|---|---|
| DE | 102006056154 A1 | 5/2008 |
| EP | 0969285 A2 | 1/2000 |
| WO | 03090376 A1 | 10/2003 |
| WO | 2009143466 A2 | 11/2009 |

OTHER PUBLICATIONS

European Search Report from EP No. 11163997.7, dated Mar. 8, 2013.
Da Silva, M., "Trigger-Capture-Analyze: Three Steps Toward Understanding Today's Complex RF Signals," Microwave Journal, Horizon House Publications, Norwood, MA, US, vol. 47, No. 2, Mar. 1, 2004.

* cited by examiner

*Primary Examiner* — Elias Desta
(74) *Attorney, Agent, or Firm* — Michael A. Nelson; Francis I. Gray (57) ABSTRACT

A "density trace" according to an embodiment of the present invention is formed by measuring the density of each column of a frequency domain bitmap above a user-specified "amplitude threshold." The density of each column equals the sum of the densities of all of the pixels in the column that are above the amplitude threshold divided by the sum of the densities of all of the pixels in the column. A density trace provides a convenient way to define and represent the occupancy for a large number of columns, and also allows density data to be quickly transmitted from one instrument or computer to another. In some embodiments, a density trace is incorporated into a trigger detector of a test and measurement instrument and used to generate a trigger signal. The trigger detector compares the density trace to a user-specified "density threshold" and generates the trigger signal when the value of any point of the density trace violates the density threshold.

13 Claims, 6 Drawing Sheets

DENSITY TRACE MEASUREMENT

FIELD OF THE INVENTION

The present invention relates to test and measurement instruments, and more particularly to density measurements for frequency domain bitmaps.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These instruments seamlessly capture RF signals so that, unlike conventional swept spectrum analyzers and vector signal analyzers, no data is missed within a specified bandwidth.

Figure 1:
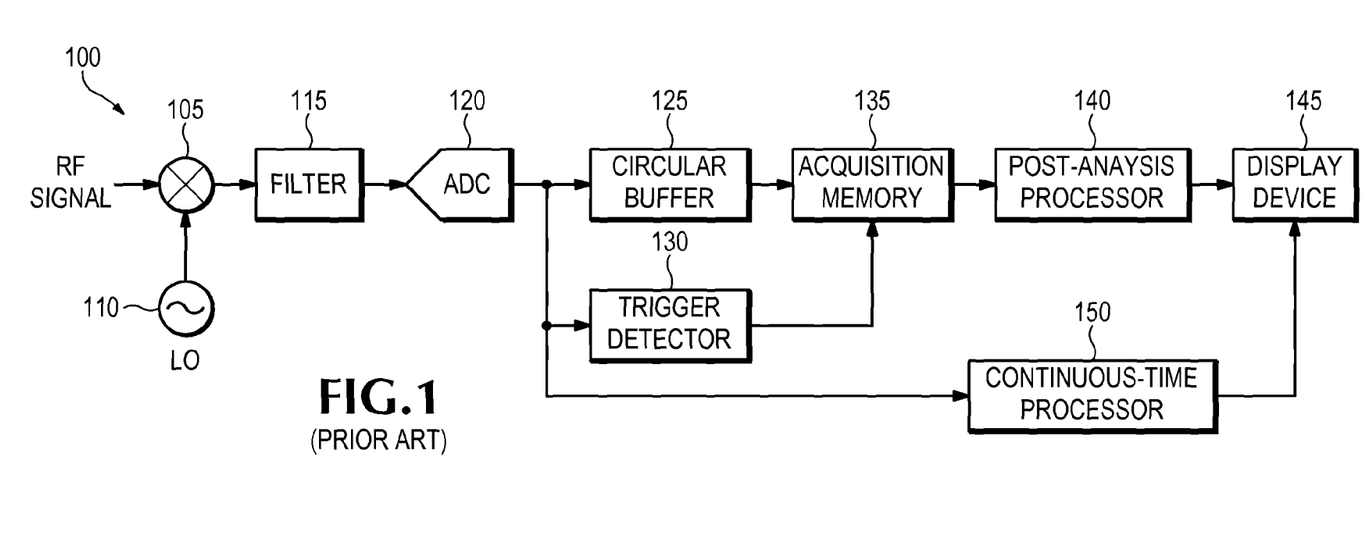
FIG. 1 depicts a high-level block diagram of a conventional real-time spectrum analyzer.

Referring now to FIG. 1, a real-time spectrum analyzer 100 receives a radio frequency (RF) input signal and optionally down-converts it using a mixer 105, local oscillator (LO) 110, and filter 115 to produce an intermediate frequency (IF) signal. An analog-to-digital converter (ADC) 120 digitizes the IF signal to produce a continuous stream of digital samples. The digital samples are input to a circular buffer 125 and also input to a trigger detector 130 that processes the digital samples in real-time and compares the processed samples to a user-specified trigger threshold. When the processed digital samples violate the trigger threshold, the trigger detector 130 generates a trigger signal that causes an acquisition memory 135 to store the digital samples held in the circular buffer 125. "Violate" means either "exceeds" or "is less than," depending on a user-specified parameter. The stored digital samples are then analyzed by a post-analysis processor 140, and the results may be displayed on a display device 145 or stored in a storage device (not shown).

Figure 2:
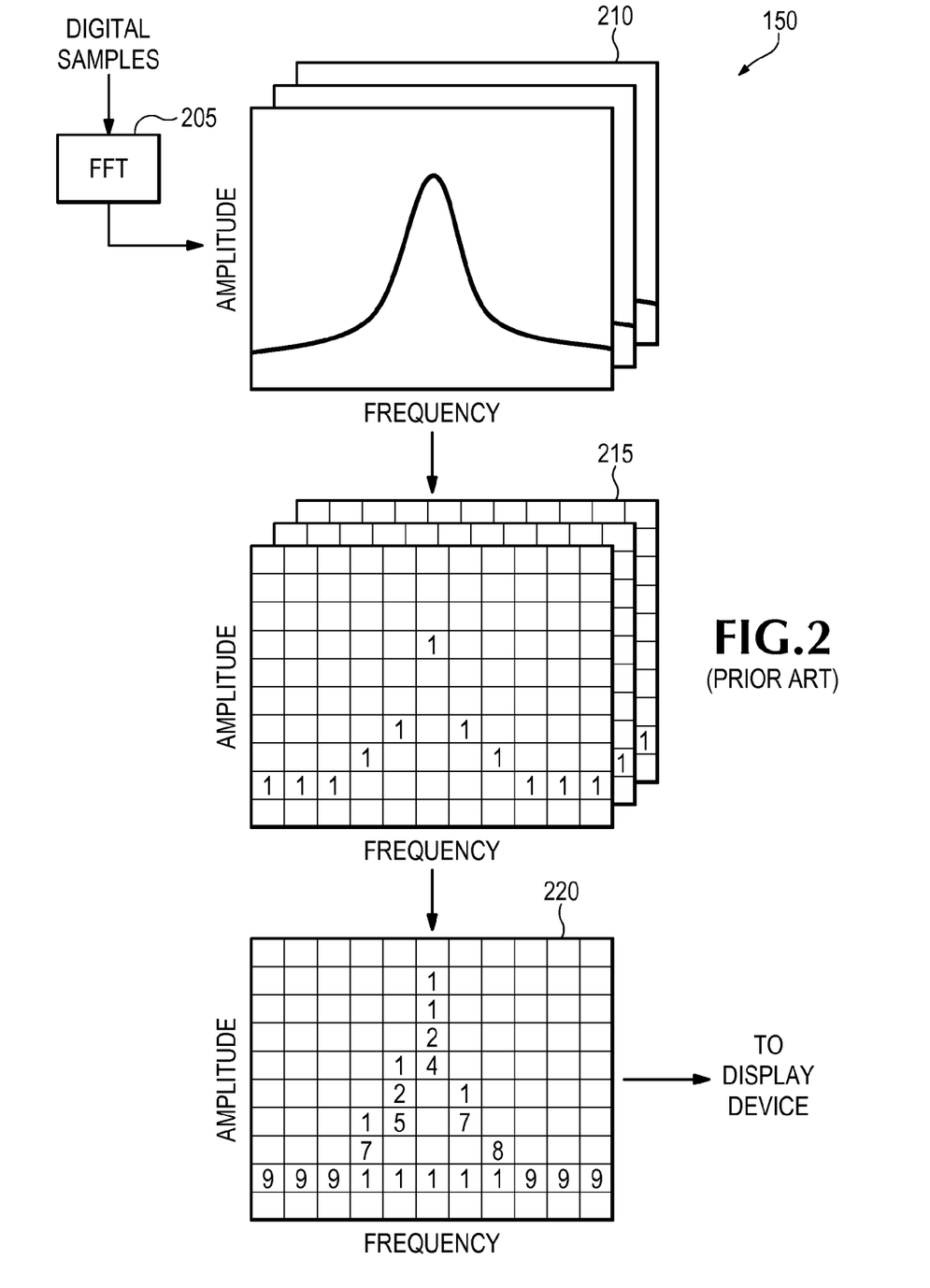
FIG. 2 depicts a high-level functional block diagram of the continuous-time processor shown in FIG. 1.

Tektronix real-time spectrum analyzers use a technology referred to as "Digital Phosphor" or alternatively as "DPX®." A DPX-enabled real-time spectrum analyzer uses a continuous-time processor 150 to process the continuous stream of digital samples from the ADC 120 in real-time and display the results on the display device 145. Referring now to FIG. 2, the continuous-time processor 150 uses a frequency transform 205 such as a fast Fourier transform (FFT), a chirp-Z transform, or the like to transform the continuous stream of digital samples into thousands of spectra 210 every second. The spectra 210 are then combined to form a data structure referred to as a "bitmap database" 220. In one embodiment, each spectrum 210 is rasterized to produce a "rasterized spectrum" 215. A rasterized spectrum comprises an array of cells arranged in of a series of rows and columns, with each row representing a particular amplitude value and each column representing a particular frequency value. The value of each cell is either a "1," also referred to as a "hit," which indicates that the input signal was present at that particular location in the amplitude versus frequency space during the measurement period, or a "0" (depicted as a blank cell in the Drawings), which indicates that it was not. The values of the corresponding cells of the rasterized spectra 215 are summed together to form the bitmap database 220, and then the value of each cell of the bitmap database 220 is divided by the total number of rasterized spectra 215 so that it indicates the total number of hits during the measurement period divided by the total number of rasterized spectra 215, or equivalently, the percentage of time during the measurement period that the input signal occupied that particular location in the amplitude versus frequency space, also referred to as the "DPX Density®." The rasterized spectra 215 and the bitmap database 220 are depicted in the Drawings as having 10 rows and 11 columns for simplicity, however it will be appreciated that in an actual embodiment, the rasterized spectra 215 and the bitmap database 220 may have hundreds of columns and rows. The bitmap database 220 is essentially a three-dimensional histogram, with the x-axis being frequency, the y-axis being amplitude, and the z-axis being density. The bitmap database 220 may be displayed as an image referred to as a "bitmap" on the display device 145, with the density of each cell being represented by a color-graded pixel. Alternatively, the bitmap database 220 may be stored in a storage device (not shown). DPX acquisition and display technology reveals signal details such as short-duration or infrequent events that are completely missed by conventional spectrum analyzers and vector signal analyzers. For more information on DPX, see Tektronix document number 37W-19638 titled "DPX® Acquisition Technology for Spectrum Analyzers Fundamentals" dated Aug. 20, 2009, available at http://www.tek.com/.

DPX-enabled real-time spectrum analyzers have a measurement referred to as a "density measurement," or alternatively as an "occupancy measurement." An occupancy measurement indicates the percentage of time during a measurement period that an input signal occupied a particular location in the amplitude versus frequency space. A user may measure the occupancy of a single pixel of a bitmap, or alternatively the user may measure the occupancy within a specified rectangular area in of a bitmap that encompasses multiple pixels. The density of a pixel equals the number of hits within that pixel divided by the number of spectra used to generate it:

$$\text{Density of a pixel} = \frac{\text{Number of hits}}{\text{Number of Spectra}}$$

For example, if a particular pixel contains one hit after 100 spectra are processed, then the density of that pixel equals 1/100=1%.

The density within a rectangular area equals the sum of the densities of all of the pixels within the area divided by the number of columns bound by the area:

$$\text{Density of an area} = \frac{\text{Sum of densities of all pixels within the area}}{\text{Number of columns bound by the area}}$$

Figure 3:
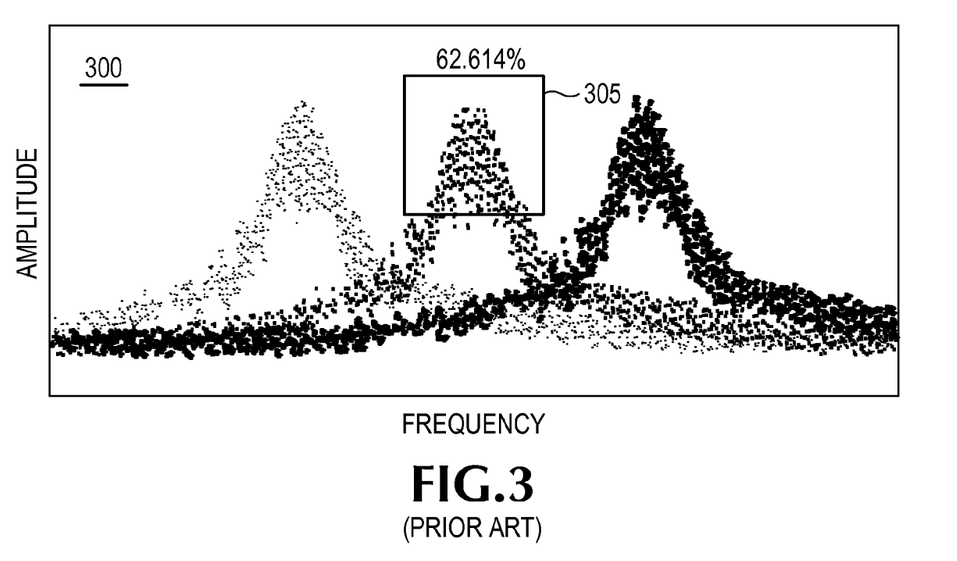
FIG. 3 depicts a bitmap having a conventional occupancy measurement.

For example, if an area includes 3 rows and 3 columns for a total of 9 pixels, and the density of each pixel is 1%, then the density of the area equals (9×1%)/3=3%. FIG. 3 depicts a bitmap 300 having such an occupancy measurement. In order to provide a more realistic depiction of an actual bitmap, the bitmap 300 is depicted in the Drawings as having hundreds of rows and columns, the gridlines of which are not shown, and the color-grading of the bitmap 300 is depicted as grey-scale, with darker shades of grey indicating that the signal was present more often. The occupancy measurement indicates that signal energy was detected within a rectangle 305 62.614% of the time that data was being collected. For more information on occupancy measurements, see co-pending U.S. Patent Application No. 61/160,216 titled "Occupancy Measurement and Triggering in Frequency Domain Bitmaps" filed on Mar. 13, 2009.

SUMMARY OF THE INVENTION

The conventional density measurement described above is useful for quantifying signal occupancy in a limited number of areas of the amplitude versus frequency space, however is not convenient if a user desires to make an occupancy measurement for every column of a bitmap.

Another deficiency of the conventional density measurement is that it is difficult to quickly transmit density data from one instrument or computer to another. The conventional approach is to save a bitmap database to a file and then transmit the entire file. While this approach is straightforward, the file cannot be transmitted in real-time using commonly-available transmission methods because the file size is so large.

What is needed is a way of conveniently defining and representing the occupancy for a large number of columns. What is also needed is a way to quickly transmit density data from one instrument or computer to another using commonly-available transmission methods.

Accordingly, a "density trace" according to an embodiment of the present invention is formed by measuring the density of each column of a frequency domain bitmap above a user-specified "amplitude threshold." The density of each column equals the sum of the densities of all of the pixels in the column that are above the amplitude threshold divided by the sum of the densities of all of the pixels in the column. A density trace provides a convenient way to define and represent the occupancy for a large number of columns, and also allows density data to be quickly transmitted from one instrument or computer to another. In some embodiments, a density trace is incorporated into a trigger detector of a test and measurement instrument and used to generate a trigger signal. The trigger detector compares the density trace to a user-specified "density threshold" and generates the trigger signal when the value of any point of the density trace violates the density threshold.

The objects, advantages and other novel features of the present invention are apparent from the following detailed description when read in conjunction with the appended claims and attached drawing.

DETAILED DESCRIPTION OF THE INVENTION

Figure 4:
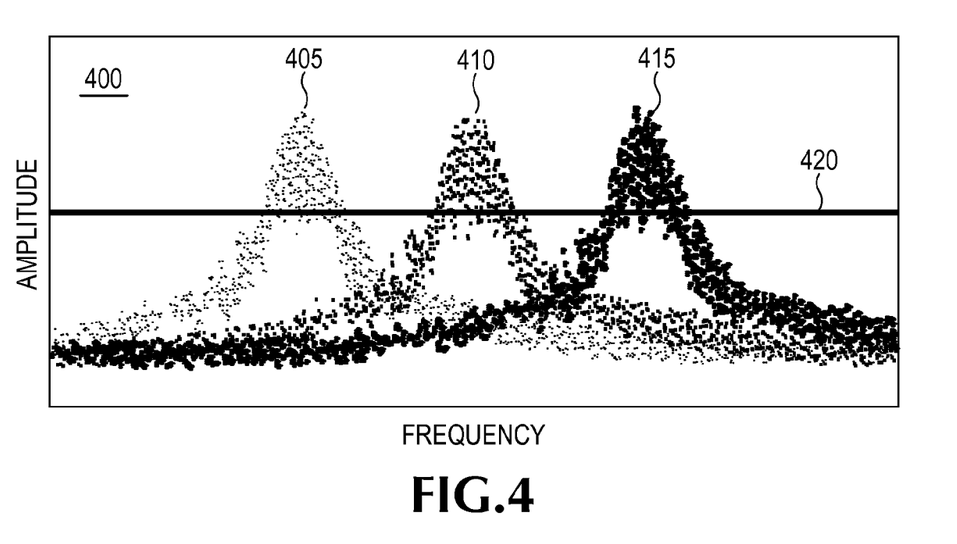
FIG. 4 depicts a bitmap having an amplitude threshold according to an embodiment of the present invention.

Referring now to FIG. 4, a "density trace" according to an embodiment of the present invention is formed by measuring the density of each column of a bitmap 400 above a user-specified "amplitude threshold" 420. The density of each column equals the sum of the densities of all of the pixels in the column that are above the amplitude threshold divided by the sum of the densities of all of the pixels in the column:

$$\text{Density of a column} = \frac{\text{Sum of densities of all pixels in column above amplitude threshold}}{\text{Sum of densities of all pixels in column}}$$

For example, if a particular column of the bitmap 400 has 100 pixels, 90 of which are above the amplitude threshold 420, and the density of each pixel in the column is 1%, then the density of the column equals $(90 \times 1\%)/(100 \times 1\%) = 90\%$.

Since density equals the total number of hits divided by the total number of spectra, the density of a column above an amplitude threshold may be equivalently defined as the number of hits contained within all of the pixels of the column above the amplitude threshold divided by the number of spectra used to generate it:

$$\text{Density of a column} = \frac{\text{Number of hits within all pixels of column above amplitude threshold}}{\text{Number of spectra}}$$

For example, if a particular column of the bitmap 400 has 100 pixels, 90 of which are above the amplitude threshold 420, and each of the pixels in the column contains one hit after 100 spectra are processed, then the density of the column equals $90/100 = 90\%$.

Figure 5:
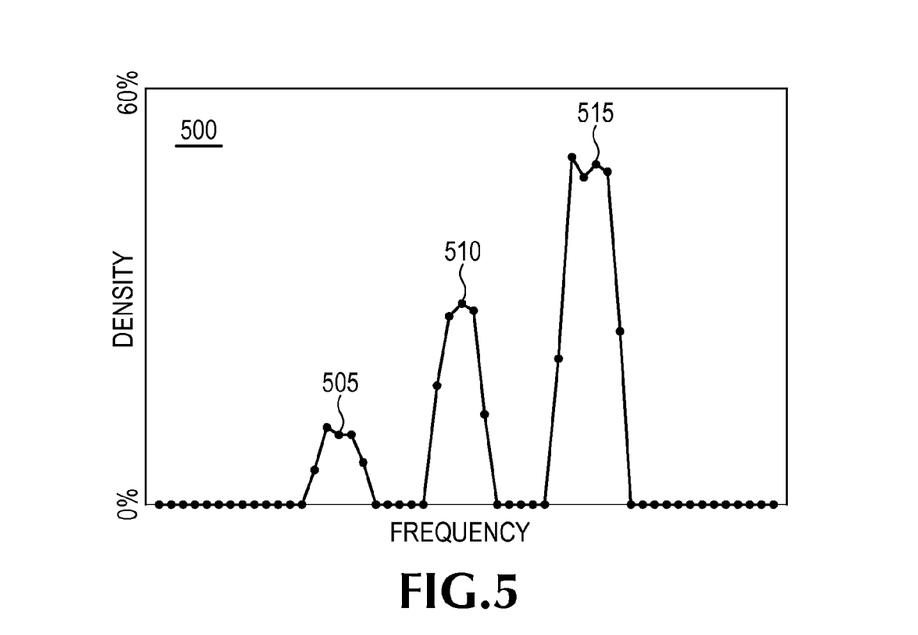
FIG. 5 depicts a density trace according to an embodiment of the present invention.

This density measurement is carried out for each column of the bitmap 400. The resulting set of density measurements may be displayed as a graph of density versus frequency 500 as shown in FIG. 5. The measured density is low at location 505, higher at location 510, and higher still at location 515 because, referring back to FIG. 4, the signal exceeded the amplitude threshold 420 less often at location 405, more often at location 410, and more often still at location 415 during the measurement period.

A density trace requires much less data than a full bitmap database because it requires only one value for each column instead of one value for each row of each column. In other words, a density trace reduces the number of dimensions required to store density data. For example, a bitmap database having 200 rows and 200 columns requires $200 \times 200 = 40,000$ values, whereas a density trace for the same bitmap database requires only 200 values or 0.5% of the data. Since a density trace requires much less data, a density trace can be transmitted through commercially available data busses much more quickly.

One practical application of a density trace is measuring the percentage of time that a communication channel is occupied, also referred to as "channel occupancy." Conventional methods of measuring channel occupancy using swept spectrum analyzers and vector signal analyzers suffer from the disadvantage that their data acquisition is not continuous, and thus signal events can be missed if they occur during the time between sweeps or acquisitions. In contrast, a channel occupancy measurement based on a density trace from a real-time spectrum analyzer is based on a seamless data capture, and thus no data is missed for signals meeting a minimum-duration requirement.

Figure 6:
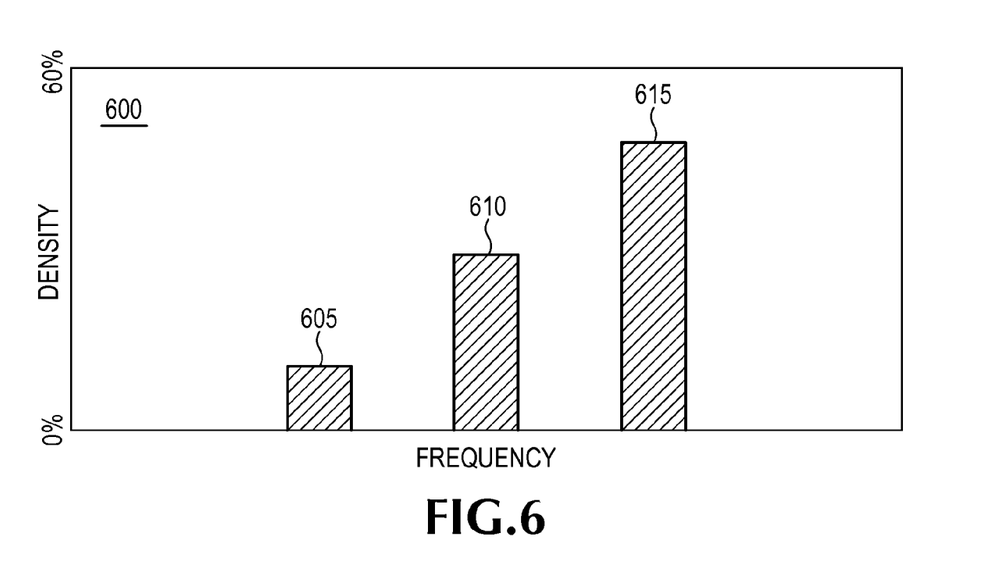
FIG. 6 depicts a density trace according to another embodiment of the present invention.

Rather than reporting the occupancy of each column of a bitmap, a density trace may report the occupancy of multiple contiguous columns referred to as "bins." When multiple contiguous columns are combined into a single bin, the reported composite occupancy value may be the maximum of the included column occupancy values, the average of the included column occupancy values, or any other metric. For example, FIG. 6 shows a density trace 600 in which all of the columns of FIG. 5 are represented by seven bins, with each bin indicating the maximum of the included column occupancy values. The user can specify the mapping of columns to bins in various ways, for example by defining the number of columns per bin, by defining "channels" in terms of start and stop frequencies, and so on. Transmission of these kinds of density traces is even faster because there are fewer data points in the file or data stream.

It will be appreciated that various modifications may be made to a density trace without departing from the spirit and scope of the invention. For example: A density trace may be displayed in any plot style such as a line graph as shown in FIG. 5, a column chart as shown in FIG. 6, a pie chart, and so on. The bins of a density trace are not required to butt directly up against each other as shown in FIG. 6, but rather there may be frequency gaps between the bins, or alternatively, the bins may overlap in frequency. The bins of a density trace are not required to be spaced evenly, but rather may be spaced unevenly. The bins of a density trace are not required to be of equal width, but rather may have different widths.

Figure 7:
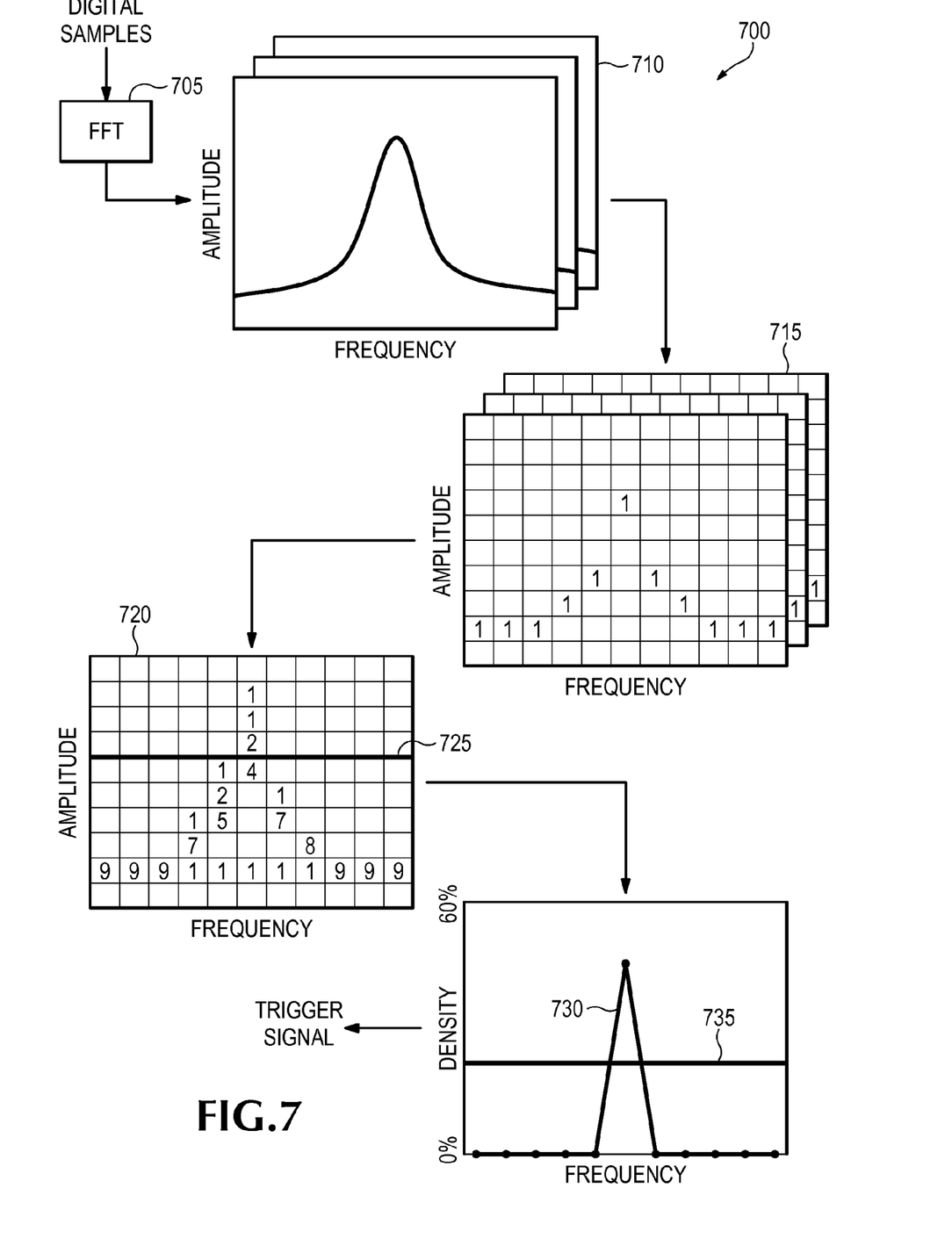
FIG. 7 depicts a high-level functional block diagram of a trigger detector according to an embodiment of the present invention.

It will be appreciated that a density trace is not only useful as a measurement, but may also be incorporated into a trigger detector of a test and measurement instrument and used to generate a trigger signal. For example, as shown in FIG. 7, a trigger detector 700 uses a frequency transform 705 to transform a continuous stream of digital samples from an ADC into thousands of spectra 710 every second. The spectra 710 are combined to form a bitmap database 720 by, for example, rasterizing each spectrum 710 to produce a rasterized spectrum 715, summing together the values of the corresponding cells of the rasterized spectra 715 to form the bitmap database 720, and then dividing the value of each cell of the bitmap database 720 so that it indicates density. The density of each column of the bitmap 720 above an amplitude threshold 725 is measured to produce a density trace 730. The density trace 730 is compared to a user-specified "density threshold" 735. When the value of any point of the density trace 730 violates the density threshold 735, a trigger signal is generated that causes a test and measurement instrument to store digital samples into a memory.

In another embodiment, the trigger detector 700 includes one or more time qualifiers (not shown) for measuring the length of time that the density trace 730 violates the density threshold 735. A trigger signal is generated if this length of time is less than, greater than, or equal to a user-specified time value, depending on a user-specified parameter.

Figure 8:
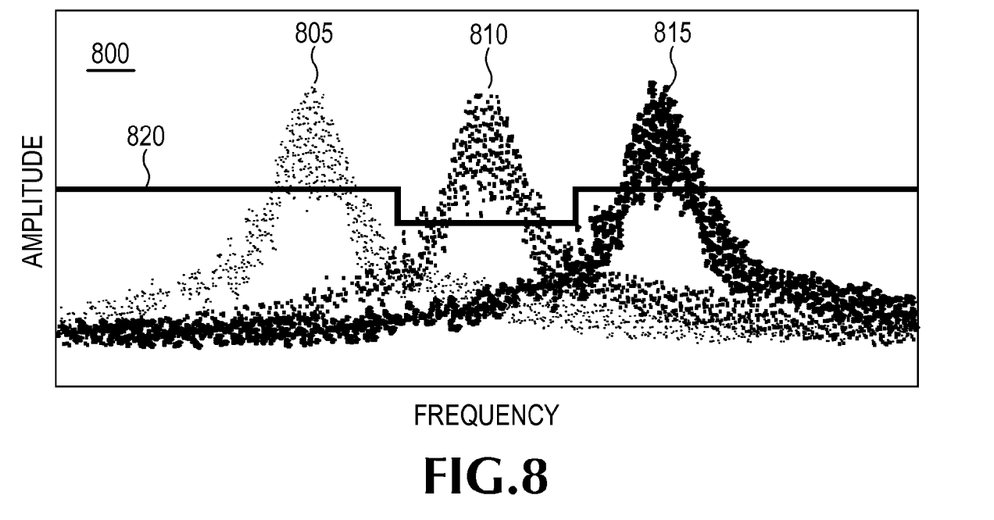
FIG. 8 depicts a bitmap having an amplitude mask according to an embodiment of the present invention.

Rather than specifying that a single amplitude threshold is to be used for every column of a bitmap as shown in FIG. 4, a user may specify a different amplitude threshold for each column as shown in FIG. 8. This is particularly useful if the noise floor is higher in some columns than in other columns. Furthermore, instead of specifying that an amplitude threshold is to be applied to every column of a bitmap, a user may specify that an amplitude threshold is to be applied to only a subset or subsets of the columns.

Figure 9:
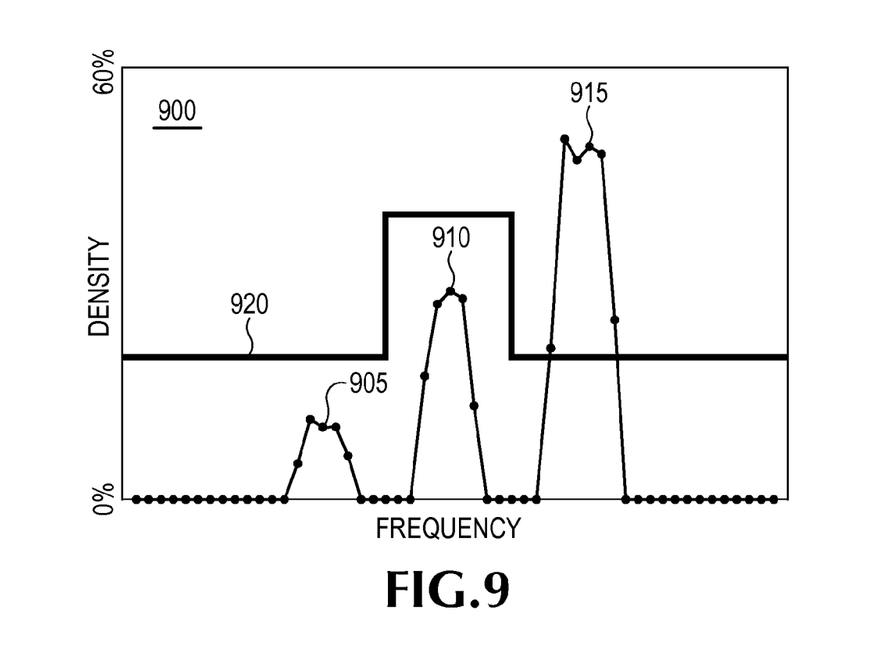
FIG. 9 depicts a density trace having a density mask according to an embodiment of the present invention.

Similarly, rather than specifying that a single density threshold is to be used for every point of a density trace as shown in FIG. 7, a user may specify a different density threshold for each point as shown in FIG. 9. Furthermore, instead of specifying that a density threshold is to be applied to every point of a density trace, a user may specify that a density threshold is to be applied to only a subset or subsets of the points. Further still, instead of specifying that a density threshold consists of a single density value, a user may specify that a density threshold consists of a range of density values, i.e., the user may specify that the trigger signal is to be generated when the measured density falls within a range of density values. Alternatively, the user may specify that the trigger signal is to be generated when the measured density falls outside of the range of density values.

Although a particular definition of the density of a column above an amplitude threshold was described above, it will be appreciated that in various other embodiments, other definitions may be used that provide substantially similar results. For example, in other embodiments, the density of a column above an amplitude threshold may be defined as the sum of the density values of all of the pixels of the column above the amplitude threshold, the average density value of all of the pixels of the column above the amplitude threshold, the maximum density value of all of the pixels of the column above the amplitude threshold, and so on.

Although the embodiments described above refer to measuring pixels of a bitmap, it will be understood that this can be considered to be equivalent to measuring cells of a bitmap database because each pixel of a bitmap represents a cell of a bitmap database.

Although many of the parameters described above are described as being "user-specified," it will be appreciated that in other embodiments, those parameters may alternatively be determined automatically by a test and measurement instrument.

In various embodiments, the post-analysis processor 140 and the continuous-time processor 150 may be implemented in hardware, software, or a combination of the two, and may comprise a general purpose microprocessor, a digital signal processor (DSP), an application specific integrated circuit (ASIC), a field-programmable gate array (FPGA), or the like.

Although the embodiments illustrated and described above show the present invention being used in a real-time spectrum analyzer, it will be appreciated that the present invention may also be used advantageously in any kind of test and measurement instrument that measures frequency domain signals such as a swept spectrum analyzer, a signal analyzer, a vector signal analyzer, an oscilloscope, and the like.

It will be appreciated from the foregoing discussion that the present invention represents a significant advance in the field of density measurements for frequency domain bitmaps. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A method of generating a density trace comprising the steps of:
   digitizing an analog signal to produce a plurality of digital samples;
   transforming the plurality of digital samples into a plurality of spectra;
   combining the plurality of spectra to produce a bitmap database, wherein the bitmap database comprises a plurality of cells arranged in an array of rows and columns, and the value of each cell indicates density; and
   calculating a density trace having a plurality of points, wherein the value of each point indicates the density of one or more columns of the bitmap database above an associated amplitude threshold.

2. The method of generating a density trace as in claim 1 wherein the density of the one or more columns of the bitmap database above the associated amplitude threshold equals the sum of the densities of every cell in the one or more columns of the bitmap database that are above the associated amplitude threshold divided by the sum of the densities of all of the cells in the one or more columns.

3. The method of generating a density trace as in claim 1 wherein the combining step comprises the steps of:
rasterizing the plurality of spectra to produce a plurality of rasterized spectra, wherein each rasterized spectrum comprises a plurality of cells arranged in an array of rows and columns;
summing the values of corresponding cells of each of the rasterized spectra to form the bitmap database; and
dividing the value of each cell of the bitmap database by the total number of spectra so that it indicates density.

4. A method of acquiring digital samples comprising the steps of: generating a density trace according to the method of claim 1; generating a trigger signal when any point of the density trace violates an associated density threshold; and storing a plurality of the digital samples in a memory in response to the trigger signal.

5. The method of acquiring digital samples as in claim 4 wherein the associated density threshold comprises a range of density values.

6. The method of acquiring digital samples as in claim 5 wherein the generating step comprises the step of generating the trigger signal when the value of the point of the density trace is within the range of density values.

7. The method of acquiring digital samples as in claim 5 wherein the generating step comprises the step of generating the trigger signal when the value of the point of the density trace is outside of the range of density values.

8. The method of acquiring digital samples as in claim 4 wherein the step of generating a trigger signal comprises the steps of:
measuring a length of time that the density trace violates the associated density threshold; and
generating the trigger signal when the length of time is less than, greater than, or equal to a specified time value, depending on a specified parameter.

9. A test and measurement instrument comprising:
an analog-to-digital converter for digitizing an analog signal to produce a continuous stream of digital samples; and
a continuous-time processor for processing the continuous stream of digital samples to produce a density trace;
wherein the continuous-time processor comprises means for:
transforming a plurality of the digital samples into a plurality of spectra;
combining the plurality of spectra to produce a bitmap database, wherein the bitmap database comprises a plurality of cells arranged in an array of rows and columns, and the value of each cell indicates density; and
calculating a density trace having a plurality of points, wherein the value of each point indicates the density of one or more columns of the bitmap database above an associated amplitude threshold.

10. The test and measurement instrument as in claim 9 further comprising a display device for displaying the density trace.

11. The test and measurement instrument as in claim 9 further comprising a storage device for storing the density trace.

12. A test and measurement instrument comprising:
an analog-to-digital converter for digitizing an analog signal to produce a continuous stream of digital samples;
a trigger detector for receiving the continuous stream of digital samples and generating a trigger signal; and
a memory for storing a plurality of digital samples in response to the trigger signal;
wherein the trigger detector comprises means for:
transforming a plurality of the digital samples into a plurality of spectra;
combining the plurality of spectra to produce a bitmap database, wherein the bitmap database comprises a plurality of cells arranged in an array of rows and columns, and the value of each cell indicates density;
calculating a density trace having a plurality of points, wherein the value of each point indicates the density of one or more columns of the bitmap database above an associated amplitude threshold; and
generating the trigger signal when any point of the density trace violates an associated density threshold.

13. The test and measurement instrument as in claim 12 wherein the trigger detector further comprises means for:
measuring a length of time that the density trace violates the associated density threshold; and
generating the trigger signal when the length of time is less than, greater than, or equal to a specified time value, depending on a specified parameter.

* * * * *